United States Patent [19]

Yabe et al.

[11] Patent Number: 5,264,318

[45] Date of Patent: Nov. 23, 1993

[54] POSITIVE TYPE PHOTOSENSITIVE COMPOSITION DEVELOPABLE WITH WATER COMPRISING A PHOTOCROSSLINKING AGENT, A WATER-SOLUBLE RESIN AND AN AQUEOUS SYNTHETIC RESIN

[75] Inventors: Norio Yabe, Higashi-matsuyama; Kuniaki Monden, Sakado; Hisashi Mino, Saitama, all of Japan

[73] Assignee: Sanyo-Kokusaku Pulp Co., Ltd., Tokyo, Japan

[21] Appl. No.: 815,614

[22] Filed: Jan. 7, 1992

Related U.S. Application Data

[63] Continuation of Ser. No. 430,070, Nov. 1, 1989, abandoned, which is a continuation of Ser. No. 120,546, Nov. 13, 1987, abandoned.

[30] Foreign Application Priority Data

Jun. 15, 1987 [JP] Japan .................. 62-148724

[51] Int. Cl.$^5$ .......... G03F 7/021; G03F 7/32; G03F 7/008; G03F 1/52
[52] U.S. Cl. .......... 430/175; 430/157; 430/163; 430/167; 430/171; 430/176; 430/196; 430/197; 430/326
[58] Field of Search .......... 430/145, 196, 197, 308, 430/274, 326, 175, 176, 157, 163, 167, 171

[56] References Cited

U.S. PATENT DOCUMENTS

| | | | |
|---|---|---|---|
| 2,544,877 | 3/1951 | Bryce | 430/274 |
| 2,604,388 | 7/1952 | Staehle | 430/274 |
| 2,937,085 | 5/1960 | Seven et al. | 430/197 |
| 2,980,534 | 4/1961 | Printy et al. | 430/176 |
| 3,092,494 | 6/1963 | Sus et al. | 430/197 |
| 3,514,288 | 5/1970 | Silver | 430/326 |
| 3,544,317 | 12/1970 | Yonezawa | 40/77.966 |
| 3,591,378 | 7/1971 | Altman | 430/326 |
| 4,021,243 | 5/1977 | Steppan et al. | 430/308 |
| 4,102,686 | 7/1978 | Weinberger | 430/197 |
| 4,154,614 | 5/1979 | Tsunoda et al. | 430/308 |
| 4,273,851 | 6/1981 | Muzyczko et al. | 430/197 |
| 4,477,552 | 10/1984 | Day et al. | 430/308 |
| 4,501,806 | 2/1985 | Watanabe et al. | 430/196 |
| 4,522,910 | 6/1985 | Hallman | 430/197 |
| 4,877,714 | 10/1989 | Tsunoda et al. | 430/197 |

FOREIGN PATENT DOCUMENTS

| | | |
|---|---|---|
| 691485 | 12/1966 | Belgium . |
| 0096326 | 12/1983 | European Pat. Off. . |
| 239144 | 10/1987 | Japan . |
| 711702 | 7/1954 | United Kingdom . |
| 1408466 | 10/1975 | United Kingdom . |
| 1517961 | 7/1978 | United Kingdom . |
| 2108986 | 5/1983 | United Kingdom . |
| 2109392 | 6/1983 | United Kingdom . |
| 2155191 | 9/1985 | United Kingdom . |

*Primary Examiner*—Charles L. Bowers, Jr.
*Assistant Examiner*—John S. Chu
*Attorney, Agent, or Firm*—Oblon, Spivak, McClelland, Maier & Neustadt

[57] ABSTRACT

A positive type photosensitive composition developable with water or warm water alone of water-soluble photocrosslinking agent, water-soluble resin and synthetic resin emulsion and further a coloring agent, if necessary.

5 Claims, No Drawings

POSITIVE TYPE PHOTOSENSITIVE COMPOSITION DEVELOPABLE WITH WATER COMPRISING A PHOTOCROSSLINKING AGENT, A WATER-SOLUBLE RESIN AND AN AQUEOUS SYNTHETIC RESIN

This application is a continuation of application Ser. No. 07/430,070, filed on Nov. 1, 1989, now abandoned, which is a continuation of Ser. No. 07/120,546, filed on Nov. 13, 1987 now abandoned.

BACKGROUND OF THE INVENTION

The present invention relates to a positive type photosensitive composition. In more detail, the invention relates to the positive type photosensitive compositions to be used for making positive type image-forming materials by coating onto the supporter and is utilized mainly for printing plate-making materials, draft-duplicating materials and the like.

As the conventional photosensitive compositions used for the positive type image-forming materials, there are:

(1) Composition consisting of o-quinonediazide compound

This is a composition consisting of o-quinonediazide compound and alkali-soluble resin such as Novolak resin and a phenomenon wherein o-quinonediazide changes to alkali-soluble substance upon the irradiation of light is utilized (For example, this can be seen in Japanese Unexamined Patent Publication No. Sho 50-125806, Sho 61-5251, etc.).

(2) Composition consisting of photosensitive diazonium salt and water-soluble resin This is a composition consisting of photosensitive diazonium salt and water-soluble resins such as poly(vinyl alcohol), diacetoneacrylamide-acrylamide copolymer, etc. and a phenomenon wherein photosensitive diazonium salt and water-soluble resin give rise to the coupling reaction under the atmosphere of alkali to become water-insoluble is utilized (For example, this can be seen in Japanese Unexamined Patent Publication No. Sho 56-101141, Sho 56-101144, Sho 57-72140, Sho 57-191632, etc.).

However, these conventional photosensitive compositions have following problems, That is, ① Since both (1) and (2) use alkali solution for the development, the problem of safety during the development operation and the pollution problem in the treatment of spent water are in danger of accurrence. Moreover, the development treatment with ammonia vapor is also possible in (2), whereby the strong smell of ammonia worsens the operation environment remarkably.

② There remains the color of o-quinonediazide or the decomposed compound thereof in the images formed by (1) and there is a peculiar coloration due to the coupling reaction in (2). For these reasons, it is difficult to obtain colored images of arbitrary color in both (1) and (2), even if added coloring agent.

The purpose of the invention is to provide a positive type photosensitive composition for making positive type image-forming material wherein the development is possible with water or warm water and there do not occur the tinting due to photosensitive component or the decomposed product thereof, the coloration resulting from the image-forming reaction and the like.

As a result of diligent studies on a novel positive type photosensitive composition developable with water or warm water, the inventors have found a phenomenon wherein the positive type photosensitive composition can be obtained by using water-soluble photocrosslinking agent (for example, one shown in Japanese Patent Publication No. Sho 44-28725) having been used for negative type photosensitive composition conventionally. Namely, the phenomenon wherein the positive images are obtained by exposing a photosensitive layer coated with a composition consisting of water-soluble photocrosslinking agent, water-soluble resin and synthetic resin emulsion onto the supporter to light through positive manuscript, by immersing into water and by rubbing with a sponge has been found. Moreover, in the images thus obtained, the tinting due to photosensitive component and the coloration accompanied with image-forming reaction were not caused at all. The mechanism of this phenomenon is considered as follows:

Exposed areas

Through the exposure to active rays, the water-soluble photocrosslinking agent and the water-soluble resin in the photosensitive layer are crosslinked photochemically. And, when immersing, this photocrosslinking component swells easily to soften the photosensitive layer of this portion. Moreover, it lowers the adhesion to the supporter. Consequently, those portions are removed easily from the supporter by rubbing with a sponge, etc.

Nonexposed areas

When immersed into water, the greater part of water-soluble photocrosslinking agent and water-soluble resin in the photosensitive layer is dissolved out, but the photosensitive layer exhibits no changes such as swelling, softening, etc. and the adhesion to the supporter does also not change. Consequently, it is not removed from the supporter even if rubbed. Moreover, since the greater part of water-soluble photocrosslinking agent in the photosensitive layer is dissolved out, the remaining photosensitive layer is colorless.

The invention relates to the positive type photosensitive composition utilized the phenomenon aforementioned.

SUMMARY OF THE INVENTION

The invention concerns with a positive type photosensitive composition characterized in that it is developable with water or warm water alone and comprises a water-soluble photocrosslinking agent, water-soluble resin and synthetic resin emulsion and further a coloring agent, if necessary.

DETAILED DESCRIPTION OF THE INVENTION

In following, the invention will be explained in more detail.

As the water-soluble photocrosslinking agents usable for the photosensitive compositions of the invention, water-soluble azide compounds, diazonium salts, tetrazonium salts and other organic photosensitive substances known publicly can be used. Mentioning several kinds thereof here, they are as follows:

Water-soluble azide compounds

Sodium 4,4'-diazidestilbene-2,2'-disulfonate

Sodium 4-azide-4-azidebenzalacetophenone-2-sulfonate

Sodium 4,4'-diazidestilbene-α-carboxylate

Sodium di-(4-azide-2'-hydroxybenzal)acetone-2-sulfonate

Sodium 4-azidebenzalacetophenone-2-sulfonate

Diazo resin
Condensation product of p-diazodiphenylamine with formaldehyde.
Tetrazonium salts
Double salt of diphenyl-4,4'-bisdiazonium chloride and zinc chloride
Double salt of 3,3'-dimethyldiphenyl-4,4'-bisdiazonium chloride and zinc chloride
Double salt of 3,3'-dimethoxydimethyl-4,4'-bisdiazonium chloride and zinc chloride
Double salt of diphenylamine-4,4'-bisdiazonium chloride and zinc chloride
Double salt of diphenylmethane-4,4'-bisdiazonium chloride and zinc chloride As the water-soluble resins utilizable for the photosensitive compositions of the invention, a lot of substances such as polyacrylamide, poly(vinyl-pyrrolidone), grafted polymerizates of poly(vinyl alcohol) with vinyl monomers, water-soluble poly(vinyl butyral), glue, casein, gelatin, arabic gum, egg albumin, gums, alginic acids, polyethylene oxide, polyacrylic acid and salts thereof, polymethacrylic acid and salts thereof or mixtures thereof, further mixtures of these with poly(vinyl alcohol) and cellulose derivatives such as carboxymethylcellulose, hydroxyethylcellulose, etc., and the like can be mentioned.

As the synthetic resin emulsions to be used for the photosensitive compositions of the invention, a lot of substances such as polyacrylic acid ester, ethylene-vinyl acetate copolymer, poly (vinylidene chloride), poly(vinyl chloride), copolymers or mixtures of these, and the like can be mentioned.

Further, to the photosensitive compositions of the invention, water-dispersible coloring pigments, water-soluble dyes, leveling agents, stabilizers, matting agents, etc., which are known conventionally, can be added, if necessary.

The photosensitive composition of the invention comprises the water-soluble photocrosslinking agent, water-soluble resin and synthetic resin emulsion as described above, wherein the formulation ratio in solids of water-soluble resin to synthetic resin emulsion is 1:99 to 80:20, more preferably 5:95 to 40:60. When the amount of water-soluble resin is too much, the water resistance of the images is lowered resulting in the dropping-out of images at the time of development, and, when the amount of synthetic resin emulsion is too much, the developability is lowered. If coming off the range described above markedly, the images cannot be obtained. Moreover, the formulation ratio in solids of the sum of water-soluble resin and synthetic resin emulsion to water-soluble photocrosslinking agent is 98:2 to 70:30, more preferably 96:4 to 80:20. When the amount of water-soluble photocrosslinking agent is less than this level, the sensibility and the quality of images are lowered remarkably, and inversely, when it is over, the quality of images is worsened. If coming off the range described above markedly, the images cannot be obtained. Further, when adding the coloring agents, the amounts are preferable to be not more than 20% and not more than 10% in the cases of coloring pigment and water-soluble dye, respectively, to the sum in solids of water-soluble photocrosslinking agent, water-soluble resin and synthetic resin emulsion. The components aforementioned constituting the photosensitive composition are dissolved or dispersed for the preparation using water, water/alcohol mixtures or the like.

The photosensitive composition prepared in this way is coated onto the supporter to make the positive type image-forming material. As the supporters, plastic films such as poly(ethylene terephthalate), polypropylene, polyethylene, poly(vinyl chloride), polystyrene, polycarbonate, triacetate, etc., glass plate, paper laminated with polyethylene, polypropylene or the like on both sides to make water-resistant, and the like can be mentioned. Moreover, plastic films provided the draft-ability such as sand mat film made by sand-blasting method to give the writing quality with pencil, Japanese ink, ball pen, etc. on one side or both sides, etching mat film etched with alkali, and the like, and further opalized films milled with white pigments and the like can be used. The photosensitive layer may be coated directly onto said supporter, but it is desirable to provide the corona treatment, coating of primer or adhesive processing combined these beforehand in order to improve the adhesion. As the primers, for example, phenol resin, polyester resin, urethane resin, vinylidene chloride-vinyl acetate copolymer, vinylidene chloride-acrylonitrile copolymer, etc. and mixtures of these are used. The thickness of coating on the supporter is preferable to be 0.1 to 2.0 $\mu$m.

The coating onto the supporter is performed by an arbitrary method among rotary coating, roll coating, bar coating, brush coating, etc. The coating weight is selected so as the thickness of coated film to be about 1 to 5 $\mu$m, preferably about 2 $\mu$m after drying. The thinner the thickness of coated film, the better the resolution of images. After coating, the drying with hot air is conducted usually, but it may be done with air.

The positive type image-forming materials made up using the photosensitive compositions of the invention are submitted to the formation of images through following processes.

(1) Exposure to light

The manuscript is superposed on the coated surface of the photosensitive composition of image-forming material made up, and, to this, active rays from various mercury arc lamps, carbon arc lamp, xenon lamp, metal halide lamp, UV fluorescent lamp, etc. are irradiated.

(2) Immersion into water or warm water

The image-forming material exposed to light is immersed into water or warm water to swell the nonimage areas. The temperature of water at this time is not particularly restricted, but, at high temperature, the swelling of nonimage areas is faster and the time of immersion can be shortened. The temperature of water is selected to be 5° to 50° C., more preferably 25° to 45° C. from the connection with operability, though it depends upon the selection of respective components constituting the photosensitive composition. The time of immersion is determined from the time until the nonimage areas swell sufficiently.

(3) Removal of nonimage areas and drying

The photosensitive surface of the image-forming material immersed as above is rubbed with a sponge containing water to remove the nonimage areas. Then, drying is conducted.

EXAMPLE 1

A liquor (photosensitive liquor)

| | |
|---|---|
| Diazo resin (Condensation product of p-diazodiphenylamine with formaldehyde) | 0.6 parts by weight |

-continued

| | |
|---|---|
| Polyacrylamide (10% solution) (DP 10,000, made by Nakarai Kagaku Co.) | 18.0 parts by weight |
| Primal B-15 (46% emulsion) (Polyacrylic ester emulsion, made by Japan Acryl chemical Co.) | 15.7 parts by weight |
| Carbon black dispersion | 5.0 parts by weight |
| Methanol | 30.4 parts by weight |
| Water | 30.4 parts by weight |

However, the carbon black dispersion was obtained by dispersing for 3 hours on ink-mixing mill using a following recipe.

| | |
|---|---|
| Carbon black | 60 parts by weight |
| Methorose 60SH 4000 (Hydroxypropylmethylcellulose, made by Shinetsu Chemical Co.) | 10 parts by weight |
| Nonionic surfactant (Polyethyleneglycol alkylphenyl ether mixture) | 1 part by weight |
| Water | 229 parts by weight |

Onto a side of poly(ethylene terephthalate) film with a thickness of 75 μm was coated A liquor by the use of rotary coating machine and drying was conducted for 90 seconds with warm air of 90° C. to make the photosensitive layer with a thickness of 2 μm. Then, the positive manuscript was contacted closely with the photosensitive layer and the exposure was made for 10 seconds from a distance of 1 m using super high-pressure mercury lamp with 2 KW. After immersed this into warm water of 15° C. for 60 seconds to swell the nonimage areas sufficiently, the photosensitive surface was rubbed with a water-containing sponge to remove the nonimage areas, whereby black and sharp relief positive images with an optical density of 1.20 were obtained.

EXAMPLE 2

B liquor (photosensitive liquor)

| | |
|---|---|
| Sodium 4,4'-diazidestilbene-2,2'-disulfonate | 0.7 parts by weight |
| PVP K-90 (Poly(vinyl-pyrrolidone), made by General Aniline & Film Co.) | 1.0 part by weight |
| Sumielite 1010 (50% emulsion) (Ethylene-vinyl chloride copolymer emulsion, made by Sumitomo Chemical Co.) | 10.7 parts by weight |
| Methanol | 17.5 parts by weight |
| Water | 70.1 parts by weight |

Similarly to Example 1, B liquor was coated onto a side of poly(ethylene terephthalate) film with a thickness of 75 μm and dried to make the photosensitive layer with 2 μm. Then, exposure was made for 4 seconds from a distance of 1 m using super high-pressure mercury lamp with 2 KW. After immersed into warm water of 40° C. for 10 seconds to allow the nonimage areas to swell sufficiently, the photosensitive layer was rubbed lightly with a water-containing sponge under running water, whereby the non-image areas exposed to light were removed and colorless transparent positive relief images were obtained.

EXAMPLE 3

C liquor (photosensitive liquor)

| | |
|---|---|
| Double salt of 3,3'-dimethoxydiphenyl-4,4'-bisdiazonium chloride and zinc chloride | 1.5 parts by weight |
| Denkasize pc-100 (Vinyl alcohol-acrylamide copolymer, made by Denki Kagaku Kogyo K.K.) | 1.5 parts by weight |
| Vinybrane 240 (45% emulsion) (Vinyl chloride type emulsion, made by Nisshin Kagaku Kogyo K.K.) | 8.0 parts by weight |
| Carbon black dispersion | 6.5 parts by weight |
| Methanol | 30.0 parts by weight |
| Water | 52.5 parts by weight |

Onto a side of poly(ethylene terephthalate) film with a thickness of 75 μm was coated C liquor by the use of rotary coating machine and drying was conducted for 60 seconds with warm air of 90° C. to make the photosensitive layer with a thickness of 1.5 μm. Then, the positive manuscript was contacted closely with the photosensitive layer and the exposure was made for 12 seconds from a distance of 1 m using super high-pressure mercury lamp with 2 KW. After immersed this into warm water of 15° C. for 60 seconds to swell the nonimage areas sufficiently, the photosensitive surface was rubbed with a water-containing sponge to remove the nonimage areas, whereby black and sharp relief positive images with an optical density of 0.85 were obtained.

EXAMPLE 4

D liquor (photosensitive liquor)

| | |
|---|---|
| Sodium 4,4'-diazidestilbene-2,2'-disulfonate | 0.9 parts by weight |
| PVP K-90 | 0.8 parts by weight |
| Sumikaflex 830 (50% emulsion) (Vinyl acetate-ethylene-vinyl chloride copolymer emulsion, made by Sumitomo Chemical Co.) | 16.4 parts by weight |
| Carbon black dispersion | 5.0 parts by weight |
| Methanol | 38.5 parts by weight |
| Water | 38.5 parts by weight |

Onto a side of poly(ethylene terephthalate) film with a thickness of 75 μm was coated D liquor by the use of rotary coating machine and drying was conducted for 60 seconds with warm air of 90° C. to make the photosensitive layer with a thickness of 1.5 μm. Then, the positive manuscript was contacted closely with the photosensitive layer and the exposure was made for 12 seconds from a distance of 1 m using super high-pressure mercury lamp with 2 KW. After immersed this into warm water of 40° C. for 30 seconds to swell the nonimage areas sufficiently, the photosensitive surface was rubbed with a water-containing sponge under running water to remove the nonimage areas, whereby black and sharp relief positive images with an optical density of 1.0 were obtained.

What is claimed is:

1. A positive type photosensitive coating composition characterized in that it is developable with water or warm water alone and comprises in admixture effective amounts for a positive type photosensitive composition developable with water or warm water alone of a water-soluble photocrosslinking agent, a water-soluble resin selected from the group consisting of poly-acrylamide, poly(vinyl-pyrrolidone), vinyl alcohol-acrylamide copolymer, water-soluble poly(vinyl butyral), glue, casein, gelatin, egg albumin, gums, alginic acids, polyethylene oxide, polyacrylic acid and salts thereof, polymethacrylic acid and salts thereof, poly(vinyl alcohol), celluloses, and mixtures thereof, and an aqueous synthetic resin emulsion of a polyacrylic acid ester, ethylene-vinyl acetate copolymer, poly(vinylidene chloride), poly(vinyl chloride), ethylene-vinylchloride copolymer, vinyl acetate-ethylene-vinyl chloride copolymer, and mixtures thereof, wherein the water-soluble photocrosslinking agent is any one of a water-soluble azide compound, a diazo resin and a tetrazonium salt, and wherein the ratio in solids of water-soluble resin to synthetic resin emulsion is from 5:95 to 20:80.

2. The photosensitive composition according to claim 1, further containing an effective amount of a coloring agent.

3. The photosensitive composition according to claim 1, wherein said water-soluble resin is polyacrylamide.

4. The photosensitive composition according to claim 1, wherein said water soluble resin is poly(vinyl pyrrolidone).

5. The photosensitive composition according to claim 1, wherein said water soluble resin is a vinyl alcohol acrylamide copolymer.

* * * * *